US012670953B2

(12) United States Patent
Conte et al.

(10) Patent No.: US 12,670,953 B2
(45) Date of Patent: Jun. 30, 2026

(54) SENSE AMPLIFIER CIRCUIT, CORRESPONDING MEMORY DEVICE AND METHOD OF OPERATION

(71) Applicant: STMicroelectronics International N.V., Geneva (CH)

(72) Inventors: Antonino Conte, Tremestrieri Etneo (IT); Francesco La Rosa, Rousset (FR)

(73) Assignee: STMicroelectronics International N.V., Geneva (CH)

( * ) Notice: Subject to any disclaimer, the term of this patent is extended or adjusted under 35 U.S.C. 154(b) by 70 days.

(21) Appl. No.: 18/676,630

(22) Filed: May 29, 2024

(65) Prior Publication Data

US 2024/0404595 A1 Dec. 5, 2024

(30) Foreign Application Priority Data

May 31, 2023 (IT) ........................ 102023000011037

(51) Int. Cl.
*G11C 7/02* (2006.01)
*G11C 13/00* (2006.01)

(52) U.S. Cl.
CPC ........ *G11C 13/004* (2013.01); *G11C 13/0004* (2013.01); *G11C 13/0026* (2013.01); *G11C 13/0038* (2013.01)

(58) Field of Classification Search
CPC .............. G11C 13/004; G11C 13/0004; G11C 12/0026; G11C 12/0038
USPC ........................................................ 365/207
See application file for complete search history.

(56) References Cited

U.S. PATENT DOCUMENTS

| | | | | | |
|---|---|---|---|---|---|
| 4,733,373 | A | * | 3/1988 | Murotani ............ | G11C 11/4094 |
| | | | | | 365/205 |
| 5,297,097 | A | * | 3/1994 | Etoh ...................... | G11C 11/406 |
| | | | | | 327/530 |
| 5,777,934 | A | * | 7/1998 | Lee ...................... | G11C 11/4074 |
| | | | | | 365/189.09 |
| 6,373,753 | B1 | * | 4/2002 | Proebsting ............. | G11C 5/145 |
| | | | | | 257/E21.659 |
| 7,379,340 | B2 | * | 5/2008 | Hosono .................. | G11C 16/26 |
| | | | | | 365/204 |

(Continued)

OTHER PUBLICATIONS

IT Search Report and Written Opinion for priority application, IT Appl. No. 102023000011037, report dated Jan. 24, 2024, 6 pgs.

*Primary Examiner* — Viet Q Nguyen
(74) *Attorney, Agent, or Firm* — Crowe & Dunlevy LLC

(57) ABSTRACT

A sense amplifier circuit includes first, second inputs coupled to first, second memory sensing nodes, respectively. A sensing circuit operates to sense a differential signal between the first, second inputs. A first boosting capacitor has a first terminal coupled to the first input and a second terminal coupled to a switchable node. A second boosting capacitor has a first terminal coupled to the second input and a second terminal coupled to the switchable node. Control circuitry operates, responsive to a bitline boost activation signal having a first value, to couple the first terminals of the first, second boosting capacitors to a regulated supply voltage and drive the switchable node to ground. Responsive to the bitline boost activation signal having a second value, the first terminals of the first, second boosting capacitors are decoupled from the regulated supply voltage and the switchable node is driven to the regulated supply voltage.

8 Claims, 7 Drawing Sheets

(56)         References Cited

U.S. PATENT DOCUMENTS

| | | | |
|---|---|---|---|
| 7,894,241 B2 * | 2/2011 | Lee | G11C 7/065 |
| | | | 365/203 |
| 9,542,995 B2 * | 1/2017 | Sachdev | G11C 11/419 |
| 2011/0063915 A1 * | 3/2011 | Tanaka | G11C 16/32 |
| | | | 365/205 |
| 2014/0071747 A1 | 3/2014 | Jurasek et al. | |
| 2019/0066805 A1 | 2/2019 | Tran et al. | |
| 2019/0108886 A1 | 4/2019 | Paolino et al. | |
| 2020/0168266 A1 | 5/2020 | Yamazaki et al. | |
| 2021/0312968 A1 | 10/2021 | Vimercati | |
| 2022/0343960 A1 | 10/2022 | Guo | |

* cited by examiner

SENSE AMPLIFIER CIRCUIT, CORRESPONDING MEMORY DEVICE AND METHOD OF OPERATION

PRIORITY CLAIM

This application claims the priority benefit of Italian application for Patent No. 102023000011037 filed on May 31, 2023, the content of which is hereby incorporated by reference in its entirety to the maximum extent allowable by law.

TECHNICAL FIELD

The description relates to circuits and methods for biasing the bit lines of a memory device via a sense amplifier circuit.

Such sense amplifiers may be used, for instance, during read operation from non-volatile memories (NVM) such as embedded phase-change memories (embedded PCM or ePCM). Such memories may be applied, for instance, to general-purpose microcontrollers (GP MCU) and secure microcontrollers.

BACKGROUND

Read operations (e.g., fetching of data) from phase-change memories are used to output (e.g., fetch, extract) the content of PCM data words on an output data bus (e.g., a 145-bit bus DATA_OUT[144:0]).

FIG. 1 is a (simplified) circuit diagram exemplary of a reading architecture in a PCM memory, and FIG. 2 is a time diagram including waveforms of signals during a read operation in the architecture of FIG. 1. As exemplified in FIG. 1, a memory 10 includes an array of memory cells 102 (e.g., phase-change memory cells) arranged in bit lines 103B (here illustrated as vertical lines) and word lines $103W_1$, $103W_2$, $103W_3$ (here illustrated as horizontal lines, also collectively or individually referred to as word lines 103W) according to a memory architecture known per se. In particular, each memory cell 102 may be arranged in series to a respective selection transistor 104 (e.g., a pnp BJT transistor) between a ground voltage terminal and the respective bit line 103B. The selection transistors 104 of the same word line 103W receive the same control signal at their control (e.g., base) terminals, e.g., control signals WL1, WL2, WL3 as exemplified in FIGS. 1 and 2. Each bit line 103B may be selectively coupled (e.g., via a respective p-channel MOS transistor 106 having its current path in series to the bit line and receiving a control signal Y_SEL) to a memory supply voltage rail 108 that provides a regulated voltage $V_{REG}$ (e.g., having a target value $V_{BL\_CHARGE}$). Additionally, respective clamping transistors 110 (e.g., pnp BJT transistors) may be coupled between each bit line 103B (e.g., at the source terminals of transistors 106) and the ground terminal. The clamping transistors 110 may receive the same control signal $WL_{CLAMP}$ at their control (e.g., base) terminals. Each bit line 103B has a respective capacitive load $C_{BL}$ due to the capacitances of the memory cells 102 and/or of the transistors 106, 110.

As anticipated, a read operation in a phase-change memory as exemplified in FIG. 1 may be carried out as exemplified in FIG. 2 to read (and provide as output) the content of plural PCM words on an output data bus DATA_OUT[144:0]. Generally, in a phase-change memory, information may be stored associating two cells to each bit (datum): a SET cell (having low resistance and high current)

and a RESET cell (having high resistance and low current). A memory sense circuit may read information from the cells in differential mode.

In order to provide fast reading of the memory cells, the specification for the memory access time ($T_{ACC}$) may be particularly demanding (e.g., in the order of 10 ns). Additionally, read parallelism (e.g., reading two words in parallel) may be used to increase the throughput of the output data. As stated previously, sensing of the content of the memory cells may be carried out in differential mode: a sensing circuit reads in differential mode from the bit line BL_SET and the bit line BL_RESET, so that the SET memory cell and the RESET memory cell are selected. The SET memory cell and the RESET memory cell are selected by properly driving the control signals (word selection signals) WL1, WL2, WL3: for instance, as exemplified in FIG. 2, by keeping signals WL1 and WL3 at a high logic value (e.g., equal to value $V_{BL\_CHARGE}$) and by driving signal WL2 to a low logic value (e.g., equal to the ground voltage, 0 V), cell $102_S$ is selected as the SET cell and cell $102_R$ is selected as the RESET cell.

A voltage regulator (e.g., a low-dropout, LDO, regulator) produces the regulated voltage $V_{REG}$ at the supply rail 108 (e.g., having a target voltage value $V_{BL\_CHARGE}$). The value $V_{BL\_CHARGE}$ of voltage $V_{REG}$ should be high enough to provide a proper voltage stack to the bit lines to result in the correct values of the memory cells currents. Before sensing (e.g., differentially between BL_SET and BL_RESET), the voltage $V_{BL}$ at the selected bit lines is clamped to the value $V_{BE}$ of the base-emitter voltage of the clamping transistors 110, and then the bit lines are pre-charged to the value $V_{BL\_CHARGE}$ by the regulated voltage $V_{REG}$ by activating the transistors 106 (see in FIG. 2 the control signal $WL_{CLAMP}$ switching from a low value to a high value $V_{BL\_CHARGE}$ to switch off transistors 110 and the control signal Y_SEL switching from a high value $V_{BL\_CHARGE}$ to a low value to switch on transistors 106). The control signals WL1 and WL3 of the unselected word lines are kept at a high voltage value (e.g., $V_{BL\_CHARGE}$) so as to keep the respective selection transistors in a non-conductive state.

Embedded phase-change memories with BJT selectors as exemplified herein may thus rely on the bit lines being biased (e.g., pre-charged) to a target voltage level $V_{BL\_CHARGE}$ at each read operation. The current required for pre-charging the bit lines (i.e., pre-charge the capacitances $C_{BL}$) is provided by the LDO regulator if the supply voltage $V_{CC}$ is higher than the expected (e.g., target or required) voltage $V_{BL\_CHARGE}$. In this case, the LDO regulator provides the current directly from the supply rail $V_{CC}$ to prevent high current consumption. However, the value of the target voltage $V_{BL\_CHARGE}$ may be approximately equal to 1.76 V, that is, higher than the minimum supply voltage $V_{CCMIN}$ that may be approximately equal to 1.62 V, for different reasons (e.g., to increase the SET-RESET distance in order to enlarge the reading window for improving the reliability margins, and/or to increase the reading margin versus noise and speed requirements). In case the target voltage $V_{BL\_CHARGE}$ is higher than $V_{CCMIN}$, the LDO regulator may be unable to satisfy such a requirement, and a charge pump (CP) may be integrated in the LDO regulator to provide a boosted voltage (i.e., higher than $V_{CCMIN}$). However, activation of the charge pump may result in a relevant increase of the current consumption. For instance, current consumption during read operations may be almost doubled when the charge pump is activated.

Therefore, there is a need in the art to provide improved reading architectures for phase-change memories, in particular providing improved sense amplifiers that allow boosting the bit line voltage to a value higher than the minimum supply voltage $V_{CCMIN}$ with reduced current consumption and/or reduced area consumption.

There is a need in the art to contribute in providing such improved sense amplifiers for phase-change memories.

SUMMARY

One or more embodiments may relate to a sense amplifier circuit.

One or more embodiments may relate to a corresponding memory device.

One or more embodiments may relate to a corresponding method of operation (e.g., a memory reading method).

In an embodiment, a sense amplifier circuit for a memory device includes a first input terminal and a second input terminal configured for coupling to a first memory sensing node and a second memory sensing node, respectively. A sensing circuit is coupled to the first and second input terminals and is configured to sense a differential signal therebetween. A first boosting capacitor has a first terminal coupled to the first input terminal and a second terminal coupled to a switchable node. A second boosting capacitor has a first terminal coupled to the second input terminal and a second terminal coupled to the switchable node. Control circuitry is configured to receive a bit line boosting activation signal. In response to the bit line boosting activation signal having a first value, the first terminals of the first and second boosting capacitors are coupled to a regulated supply node that provides a regulated supply voltage and the switchable node is driven to a ground voltage. In response to the bit line boosting activation signal having a second value, the first terminals of the first and second boosting capacitors are decoupled from the regulated supply node and the switchable node is driven to the regulated supply voltage.

One or more embodiments may thus provide a sense amplifier circuit that facilitates boosting the pre-charge voltage of the bit lines, without resorting to a charge pump circuit integrated in the voltage regulator that supplies the memory device.

In an embodiment, a memory device includes a plurality of memory banks. Each memory bank is coupled to a respective sense amplifier circuit as described above. Each memory bank includes an array of memory cells arranged in a plurality of bit lines and a plurality of word lines. Each memory cell is arranged in series to a respective selection transistor between a ground terminal and the corresponding bit line, and each bit line is selectively couplable to a regulated supply node that provides a regulated supply voltage, or to one of the first and second memory sensing nodes. A voltage detector circuit is configured to sense a system supply voltage and to detect whether the system supply voltage is higher than a threshold (e.g., a target bit line pre-charge voltage). A voltage regulator circuit is coupled to the system supply voltage and is configured to produce the regulated supply voltage at the regulated supply node. The voltage detector circuit is further configured to set an LDO activation signal to a first value and disable the bit line boosting activation signal in response to the system supply voltage being higher than the threshold. The voltage detector circuit is further configured to set the LDO activation signal to a second value and enable the bit line boosting activation signal in response to the system supply voltage being lower than or equal to the threshold. The voltage detector circuit is further configured to set the bit line boosting activation signal to the first value as long as the bit lines are coupled to the regulated supply node. The voltage detector circuit is further configured to set the bit line boosting activation signal to the second value in response to a pair of selected bit lines being coupled to the first and second memory sensing nodes, respectively. The voltage regulator circuit is configured to regulate the regulated supply voltage to a value equal to the threshold in response to the LDO activation signal having the first value, and regulate the regulated supply voltage to a value as close as possible to the system supply voltage in response to the LDO activation signal having the second value.

According to another aspect of the present description, a method of operating a memory device includes: sensing the system supply voltage and detecting whether the system supply voltage is higher than a threshold; in response to the system supply voltage being higher than the threshold, setting the LDO activation signal to the first value, regulating the regulated supply voltage to a value equal to the threshold, and disabling the bit line boosting activation signal; in response to the system supply voltage being lower than or equal to the threshold: i) setting the LDO activation signal to the second value, thereby regulating the regulated supply voltage to a value as close as possible to the system supply voltage; ii) setting the bit line boosting activation signal to the first value as long as the bit lines are coupled to the regulated supply node, thereby coupling the first terminals of the first and second boosting capacitors to the regulated supply node and driving the switchable node to a ground voltage; and iii) setting the bit line boosting activation signal to the second value in response to a pair of selected bit lines being coupled to the first and second memory sensing nodes, respectively, thereby decoupling the first terminals of the first and second boosting capacitors from the regulated supply node and driving the switchable node to the regulated supply voltage.

BRIEF DESCRIPTION OF THE DRAWINGS

One or more embodiments will now be described, by way of example, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
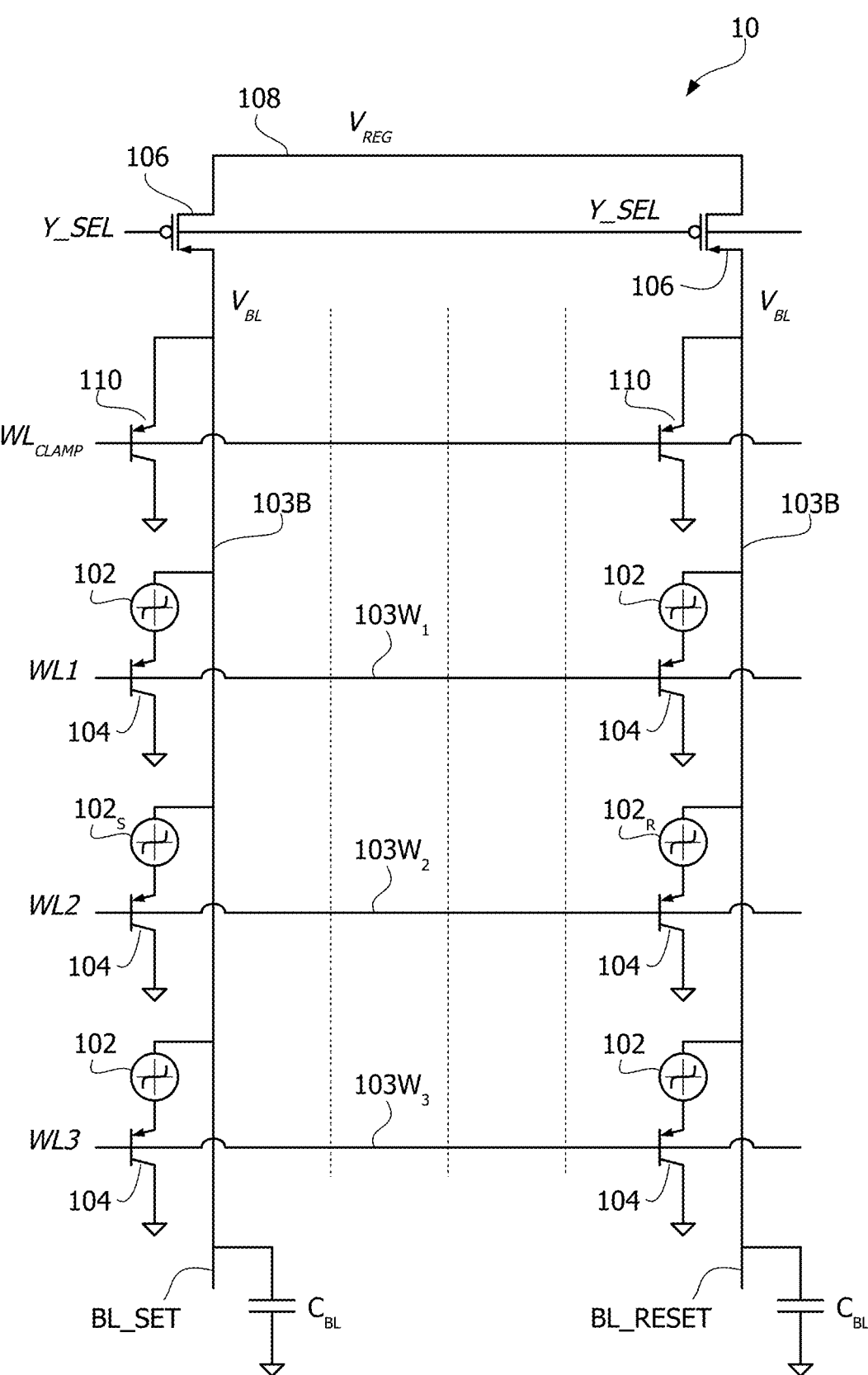
FIG. 1, previously presented, is a simplified circuit diagram exemplary of a reading architecture in a PCM memory.
Figure 2:
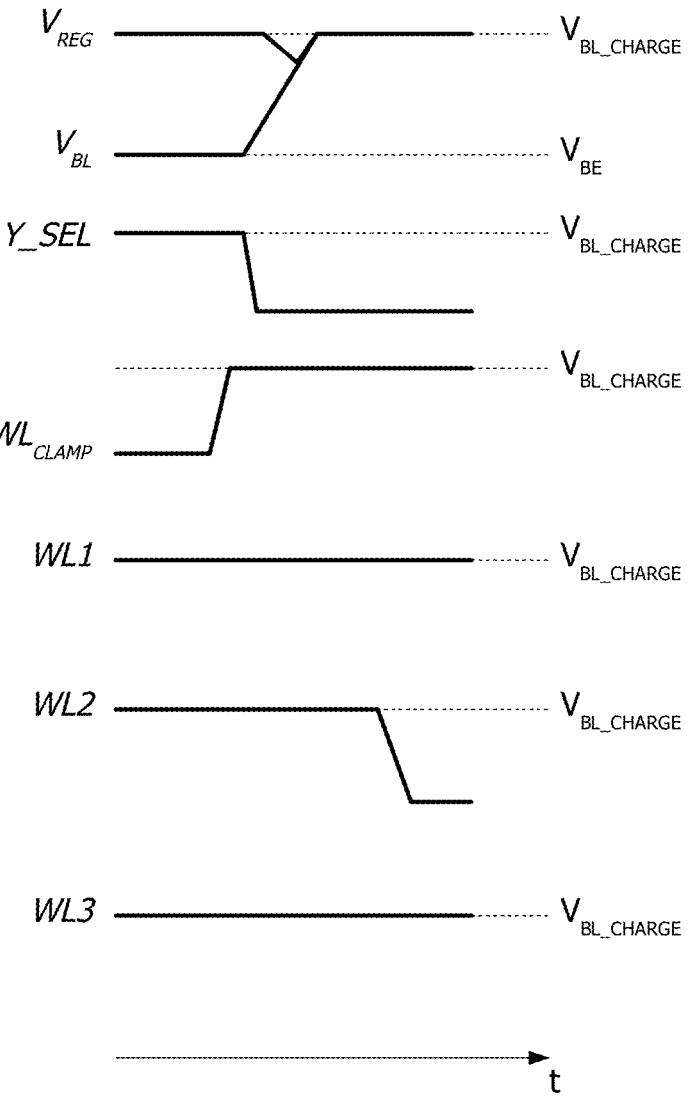
FIG. 2, previously presented, is a time diagram including waveforms of signals during a read operation in the architecture of FIG. 1.
Figure 3:
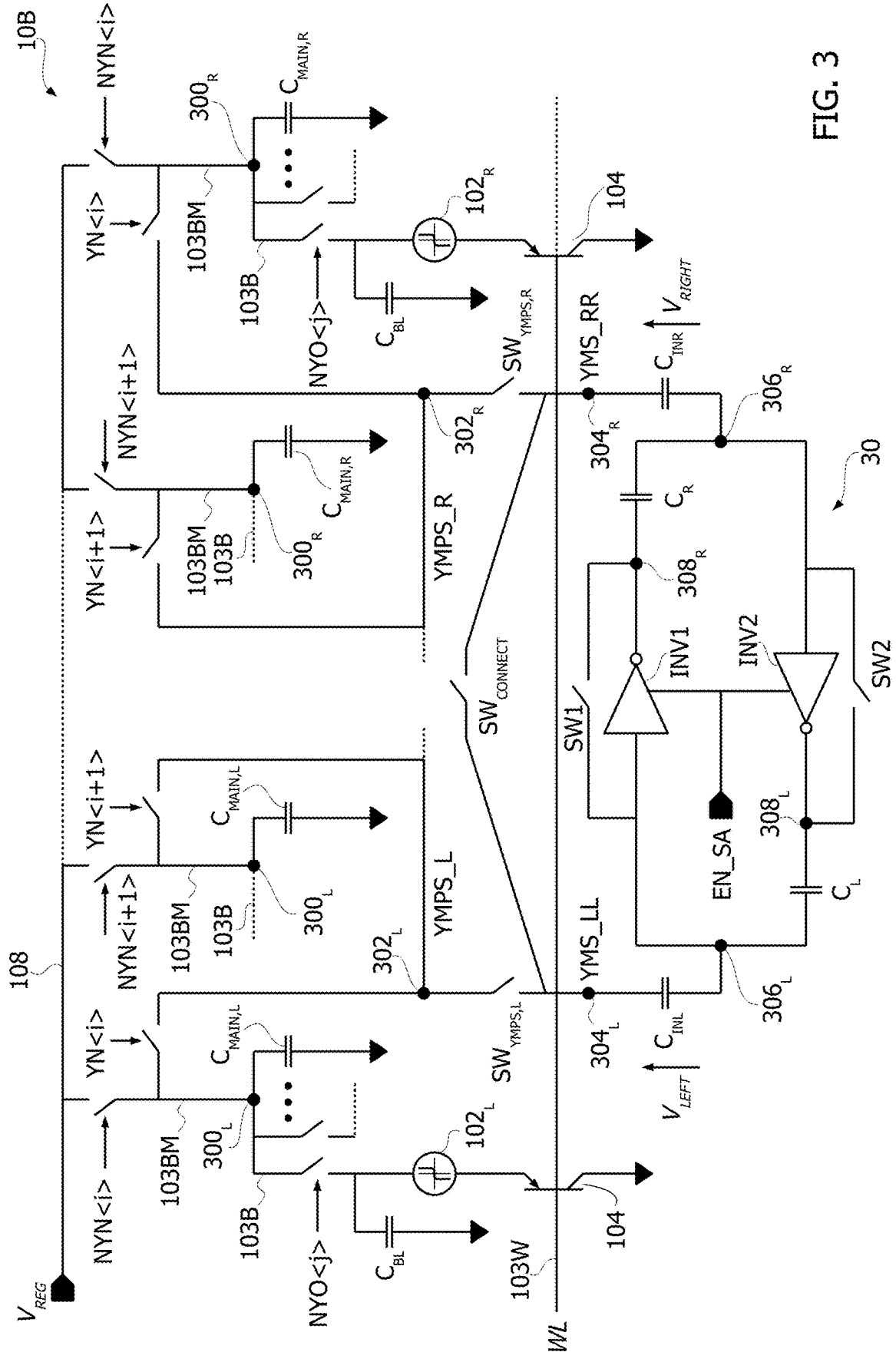
FIG. 3 is a circuit diagram exemplary of a reading architecture in a PCM memory.

By way of introduction to the detailed description of exemplary embodiments, reference may first be made to FIG. 3, which is a circuit diagram exemplary of a reading architecture of a PCM memory bank 10B. It will be noted that for ease of illustration, a single word line 103W is visible in FIG. 3, and plural bit lines 103B. It will also be noted that certain elements of the array of the memory bank 10B are illustrated only once for ease of illustration as well. The bit lines are arranged in two main groups (e.g., a left group and a right group), with the two main groups including the same number of bit lines (e.g., 16 bit lines), in order to allow differential reading. During read operations, a differential voltage is sensed between two bit lines (a SET line and a RESET line), one belonging to the left group and the other belonging to the right group. The two main groups are each subdivided in a number n of subgroups or "main bit lines" 103BM, e.g., 2 subgroups, each subgroup including a number m of bit lines, e.g., 8 bit lines. Each main bit line has an associated parasitic capacitance $C_{MAIN}$ (e.g., $C_{MAIN,L}$ for the main bit lines in the left group and $C_{MAIN,R}$ for the main bit lines in the right group). The bit lines 103B of the same main bit line 103BM are arranged in parallel between a respective common node 300 (e.g., nodes $300_L$ for the main bit lines in the left group and nodes $300_R$ for the main bit lines in the right group) and ground, and are selectively couplable to the common node 300 via respective switches arranged in series to the bit lines. These switches are controlled by respective selection signals NYO (e.g., NYO<j>, . . . , with j=1, . . . , m). Each common node 300 (e.g., each main bit line) is selectively couplable via respective switches either to the supply voltage rail 108 at voltage $V_{REG}$ or to a respective sensing node 302 (e.g., a left sensing node $302_L$ for the main bit lines of the left group and a right sensing node $302_R$ for the main bit lines of the right group). In particular, a first main bit line in the left group and a first main bit line in the right group can be coupled to rail 108 depending on the value of signal NYN<i>, a second main bit line in the left group and a second main bit line in the right group can be coupled to rail 108 depending on the value of signal NYN<i+1>, and so on (with i=1, . . . , n). In a similar way, two main bit lines at a time (one from the left group and the other from the right group) can be coupled to the respective sensing nodes $302_L$ and $302_R$ depending on the values of respective signals YN<i>, YN<i+1>, . . . (with i=1, . . . , n). The sense amplifier core 30 (e.g., a latch-type sense amplifier) includes differential input nodes $304_L$ and $304_R$. Node $304_L$ is selectively couplable to node $302_L$ via a switch $SW_{YMPS,L}$, and node $304_R$ is selectively couplable to node $302_R$ via a switch $SW_{YMPS,R}$. In particular, switches $SW_{YMPS,L}$ and $SW_{YMPS,R}$ are configured to isolate nodes $304_L$ and $304_R$ from nodes $302_L$ and $302_R$ since the latter nodes may assume high voltage values during write operations. Nodes $304_L$ and $304_L$ are selectively couplable to each other via a switch $SW_{CONNECT}$. A first input capacitor $C_{INL}$ of the sense amplifier 30 has a first terminal coupled to node $304_L$ and a second terminal coupled to a node $306_L$, and a second input capacitor $C_{INR}$ of the sense amplifier 30 has a first terminal coupled to node $304_R$ and a second terminal coupled to a node $306_R$. The sense amplifier core 30 further includes: a first inverter INV1 having an input terminal coupled to node $306_L$ and an output terminal coupled to a node $308_R$, a first capacitor CR coupled between nodes $308_R$ and $306_R$, a first switch SW1 that bypasses inverter INV1 (e.g., coupled between the input and output terminals of inverter INV1), a second inverter INV2 having an input terminal coupled to node $306_R$ and an output terminal coupled to a node $308_L$, a second capacitor CL coupled between nodes $308_L$ and $306_L$, and a second switch SW2 that bypasses inverter INV2 (e.g., coupled between the input and output terminals of inverter INV2). Inverters INV1 and INV2 are enabled by an enable signal EN_SA, and are supplied at a voltage $V_{DD}$ normally lower than the regulated voltage $V_{REG}$ (not visible in FIG. 3 for ease of illustration). Switches SW1 and SW2 may be controlled by the same equalization signal EQ (not visible in FIG. 3 for ease of illustration).

Read operation in a memory bank 10B as exemplified in FIG. 3 may be carried out according to the procedure described in the following.

In a first step, the main bit lines (e.g., all nodes $300_L$ and $300_R$) are connected to the supply voltage rail 108 and charged by voltage $V_{REG}$ to the target value $V_{BL\_CHARGE}$ (e.g., about 1.7 V). The word line signal WL applied to the word line 103W is also driven to the value $V_{BL\_CHARGE}$. Additionally, signals YN<i>, YN<i+1>, . . . are set so as to connect one of nodes $300_L$ of the left group and the corresponding (e.g., homologous, symmetrical) node $300_R$ of the right group to the sensing nodes $302_L$ and $302_R$, respectively, thereby selecting the main bit lines for reading. Additionally, sensing node $302_L$ is connected to the input node $304_L$ of the sense amplifier core 30 by closing switch $SW_{YMPS,L}$, and sensing node $302_R$ is connected to the input node $304_R$ of the sense amplifier core 30 by closing switch $SW_{YMPS,R}$. The remaining switches are open during the first step, that is: all nodes 300 that do not correspond to a selected main bit line are decoupled from the respective sensing node 302, all the bit lines are decoupled from the respective node 300 (at this stage), and switches $SW_{CONNECT}$, SW1 and SW2 of the sense amplifier core 30 are open as well. The enable signal EN_SA is set at a value that switches off the inverters INV1 and INV2, i.e., it is de-asserted (e.g., set to a low logic value, ground voltage, 0 V).

In a second step, switches SW1 and SW2 are closed (e.g., equalization signal EQ is asserted) and enable signal EN_SA is asserted (e.g., set to a high logic value) so as to activate inverters INV1 and INV2. In this step, input offset of the sense amplifier core 30 is compensated and the input capacitors $C_{INL}$, $C_{INR}$ are pre-charged.

In a third step, a selected bit line pertaining to the left group and to the selected main bit line (i.e., the left main bit line that is currently connected to node $302_L$) is connected to the corresponding main bit line (e.g., node $300_L$) by closing the respective switch via signal NYO<j>. Similarly, the corresponding selected bit line pertaining to the right group and to the selected main bit line (i.e., the right main bit line that is currently connected to node $302_R$) is connected to the corresponding main bit line (e.g., node $300_R$) by closing the respective switch via signal NYO<j>. By doing so, the selected bit lines are pre-charged, i.e., the respective capacitances $C_{BL}$ are charged from voltage $V_{BE}$ (e.g., about 0.6 V) to the target voltage $V_{BL\_CHARGE}$.

In a fourth step, the selected main bit lines (left and right) are disconnected from the supply voltage rail 108 by opening the respective switches controlled by signals NYN<i>.

In a fifth step, the word line signal WL applied to a certain word line 103W is driven to ground voltage, thereby activating the selection transistors 104 and carrying out the actual word line selection (i.e., selection of two specific memory cells $102_L$ and $102_R$). As a result, capacitive nodes $300_L$ and $300_R$ (e.g., the bit line capacitances $C_{BL}$ and the main bit line capacitances $C_{MAIN}$) start discharging and the voltage at nodes $300_L$ and $300_R$ (that are connected to the sensing nodes $302_L$ and $302_R$) drops during a so-called "discharge window". At the same time, capacitor $C_{INL}$ is charged to a certain voltage $V_{LEFT}$ and capacitor $C_{INR}$ is charged to a certain voltage $V_{RIGHT}$ depending on the resistance of the memory cells $102_L$ and $102_R$.

In a sixth step, switches $SW_{YMPS,L}$ and $SW_{YMPS,R}$ are opened to disconnect the sense amplifier core 30 (whose input terminals have been charged) from the memory array. Switches SW1 and SW2 are opened as well, and switch $SW_{CONNECT}$ is closed. In this state, sensing of the differential voltage (e.g., difference between $V_{LEFT}$ and $V_{RIGHT}$) is carried out by the sense amplifier core 30.

Figure 4:
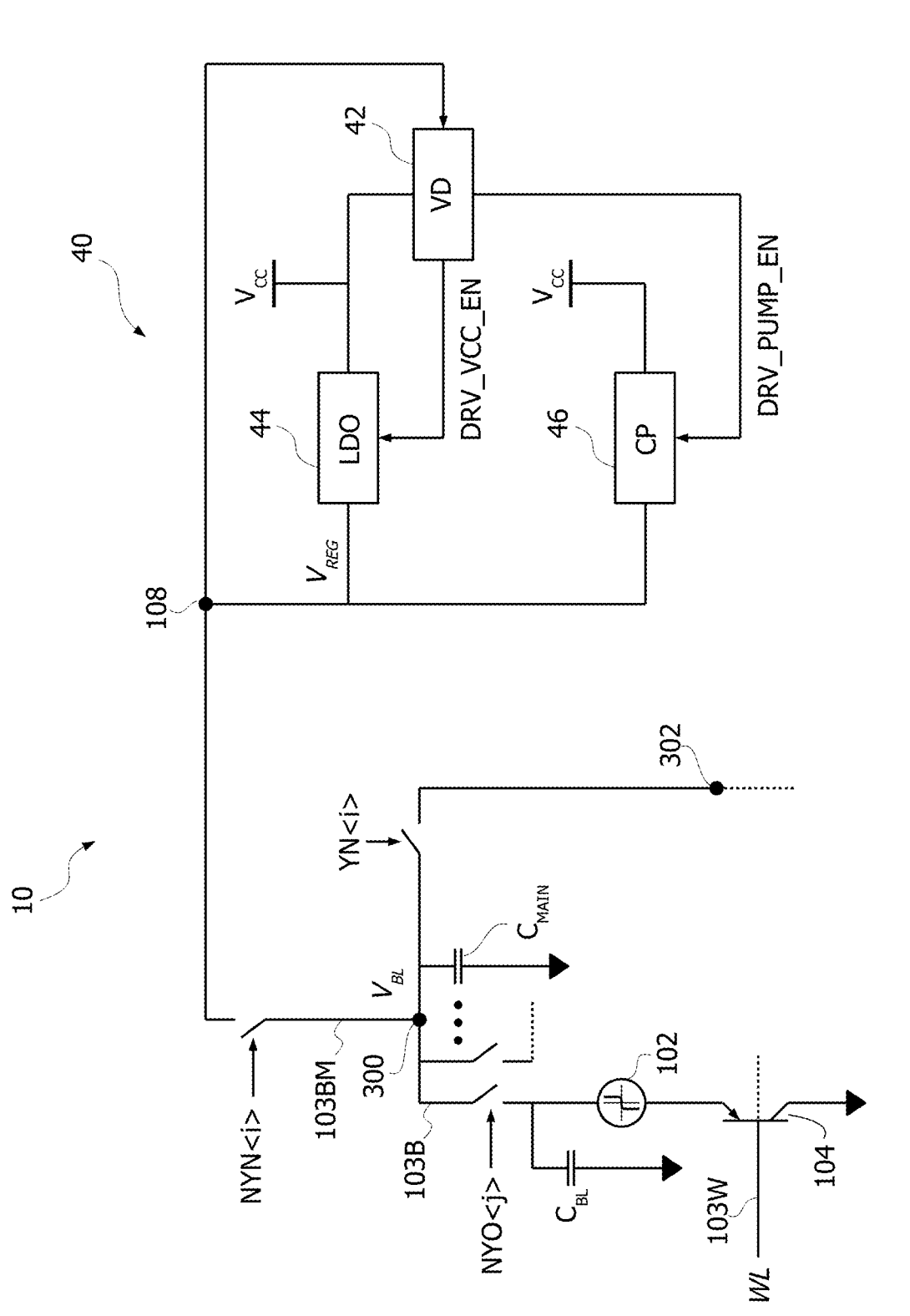
FIG. 4 is a circuit block diagram exemplary of a bit line biasing circuit.

As anticipated, a reading architecture as exemplified in FIG. 3 may thus rely on the provision of a charge pump circuit to produce the target voltage $V_{BL\_CHARGE}$ when this is higher than the supply voltage $V_{CC}$ (which also biases the LDO regulator). For instance, FIG. 4 is a circuit block diagram exemplary of such a conventional bit line biasing architecture 40. Biasing architecture 40 includes a voltage detector (VD) 42, an LDO regulator 44, and a charge pump (CP) circuit 46, all biased by the memory supply voltage $V_{CC}$. The voltage detector 42 is configured to sense the voltage $V_{REG}$ at node 108 and the voltage $V_{CC}$, and is configured to determine whether the supply voltage $V_{CC}$ is higher or lower than the expected (e.g., target or required) bit line voltage $V_{BL\_CHARGE}$. If the supply voltage $V_{CC}$ is higher than the target bit line voltage $V_{BL\_CHARGE}$, detector 42 asserts an enable signal DRV_VCC_EN to activate the LDO regulator 44, which then provides current from rail $V_{CC}$ to node 108 to pre-charge the bit line capacitance(s) $C_{BL}$, $C_{MAIN}$ at voltage $V_{BL\_CHARGE}$. If the supply voltage $V_{CC}$ is lower than (or equal to) the target bit line voltage $V_{BL\_CHARGE}$, detector 42 asserts an enable signal DRV_PUMP_EN to activate the charge pump circuit 46, which then provides current from rail $V_{CC}$ to node 108 to pre-charge the bit line capacitance(s) $C_{BL}$, $C_{MAIN}$ at voltage $V_{BL\_CHARGE}$. The inefficiency (e.g., the ratio between the input and output currents) of the LDO regulator 44 may be equal to about 1.05, while the inefficiency of the charge pump circuit 46 may be equal to about 2.6 (e.g., in the case of a one-stage charge pump). Therefore, the current consumption during read operations may be almost doubled when the charge pump 46 is activated. Further, the voltage threshold that determines the activation of the charge pump by detector 42 (i.e., switching from LDO to CP operation) may depend on the process, may be linked to the BJT threshold and may thus range from about 1.6 V to about 1.8 V.

Therefore, it is desirable to provide improved reading architectures that allow boosting the bit line voltage to a value higher than the supply value $V_{CC}$ without resorting to a charge pump circuit. In particular, this may be achieved by providing improved sense amplifiers that implement a bit line voltage boosting function.

Figure 5:
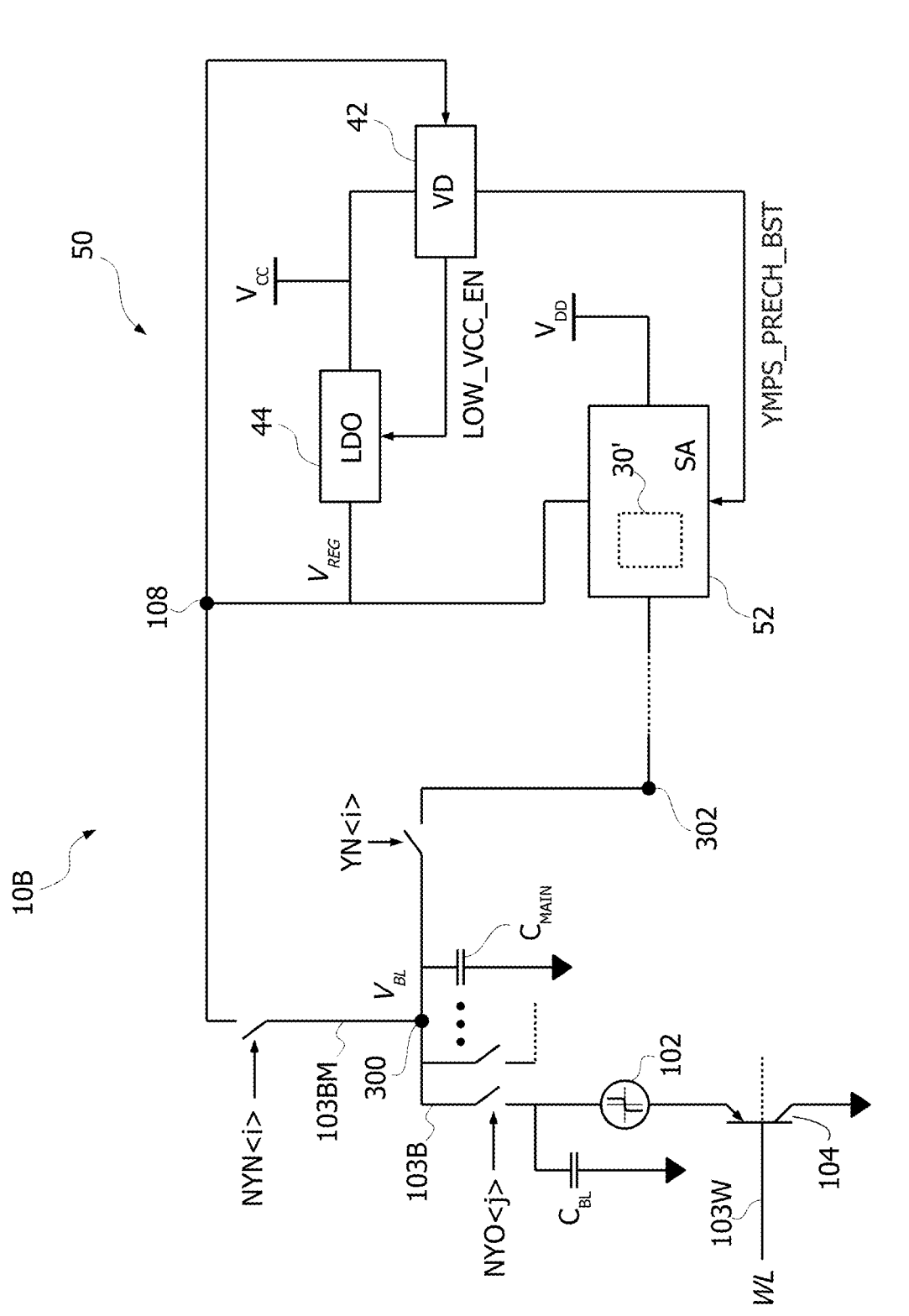
FIG. 5 is a circuit block diagram exemplary of a bit line biasing circuit.

One or more embodiments thus rely on an architecture as exemplified in FIG. 5, which is a circuit block diagram exemplary of a bit line biasing architecture 50 that includes voltage detector (VD) 42, LDO regulator 44, and a sense amplifier (SA) circuit 52 that, in addition to performing conventional sensing function with a sense amplifier core 30' (e.g., a SA core 30 as disclosed with reference to FIG. 3), implements a bit line voltage boosting function when demanded. It is noted that in the architecture of FIG. 5 (and following FIG. 6) the sense amplifier 52 may include various types of sense amplifier cores. Therefore, circuit 52 may include a SA core 30 such as the one illustrated in FIG. 3, or a different type of SA core (e.g., still latch-based but having a different internal architecture and functioning). This is also exemplified by the fact that the architecture of FIG. 6 does not include the switch SW CONNECT between nodes $304_L$ and $304_R$, insofar as operation of the sense amplifier core 30' may not need any such external switch. For instance, reference is made to the architecture of a different SA core 30' as taught by Italian application for Patent No. 102023000011031 filed on May 31, 2023 (the content of which is hereby incorporated by reference), which may be used with the sense amplifier 52 of the instant application.

The voltage detector 42 and the LDO regulator 44 are biased by the memory supply voltage $V_{CC}$ (whose value can be, for example, in the range of 1.62 V to 3.6 V), while the sense amplifier 52 is biased by a low supply voltage $V_{DD}$ (whose value can be, for example, in the range of 0.75 V to 1.1 V). The voltage detector 42 is configured to sense the regulated voltage $V_{REG}$ at node 108 and the memory supply voltage $V_{CC}$, and is configured to determine whether the memory supply voltage $V_{CC}$ is higher or lower than the expected (e.g., target or required) bit line voltage $V_{BL\_CHARGE}$ (e.g., 1.76 V).

If the memory supply voltage $V_{CC}$ is higher than the target bit line voltage $V_{BL\_CHARGE}$, detector 42 sets an activation signal LOW_VCC_EN of LDO regulator 44 to a first value (e.g., logic zero, de-asserted), which results in the LDO regulator 44 being activated to regulate its output voltage $V_{REG}$ to the target bit line voltage $V_{BL\_CHARGE}$ (e.g., 1.76 V). Thus, LDO regulator 44 provides current from rail $V_{CC}$ to node 108 to pre-charge the bit line capacitance(s) $C_{BL}$, $C_{MAIN}$ at voltage $V_{BL\_CHARGE}$. In this condition, the entire pre-charge current may be provided by the LDO regulator 44 only. At the same time, detector 42 disables the boost activation signal YMPS_PRECH_BST of the sense amplifier 52, which results in the bit line voltage boosting function of sense amplifier 52 being disabled (e.g., sense amplifier 52 only operates to sense the voltage at the bit lines).

If the memory supply voltage $V_{CC}$ is lower than (or equal to) the target bit line voltage $V_{BL\_CHARGE}$ (e.g., $V_{CC}$=1.6 V), detector 42 enables the boost activation signal YMPS_PRE-CH_BST of the sense amplifier 52 and the bit line pre-charge is carried out in two phases or steps. In the first step, detector 42 sets the activation signal LOW_VCC_EN of LDO regulator 44 to a second value (e.g., logic one, asserted), which results in the LDO regulator 44 being activated to regulate its output voltage $V_{REG}$ to the maximum voltage available (i.e., as close as possible to $V_{CC}$, possibly equal to $V_{CC}$, for instance ~1.6 V), and sets the boost activation signal YMPS_PRECH_BST of the sense amplifier 52 to a first value (e.g., logic one, asserted), which results in the sense amplifier circuit 52 charging one or more internal boosting capacitors (as described more in detail in the following). Thus, LDO regulator 44 provides current from rail $V_{CC}$ to node 108 to partially pre-charge the bit line capacitance(s) $C_{BL}$, $C_{MAIN}$ at voltage V. In this condition, a portion of the pre-charge current is provided by the LDO regulator 44. In the second step, detector 42 sets the boost activation signal YMPS_PRECH_BST of the sense amplifier 52 to a second value (e.g., logic zero, de-asserted) which results in the LDO regulator 44 being disconnected from nodes 304$_L$ and 304$_R$ and the internal boosting capacitors of the sense amplifier 52 providing charge to the bit lines to complete the pre-charge of the bit lines at voltage $V_{BL\_CHARGE}$ or above it. Therefore, the pre-charge may be completed by the sense amplifier 52 during (e.g., at the beginning of) the sensing phase by further increasing the bit line voltage $V_{BL}$ by an amount indicated as $\Delta V_{SA}$ (e.g., $\Delta V_{SA}$=0.16 V). The energy (e.g., current) used to complete the pre-charge of the bit lines is taken from the LDO regulator 44, as further discussed in the following. It is noted that, in order to reduce power consumption, the bit line voltage boosting function of sense amplifier 52 may be activated only if the supply voltage $V_{CC}$ is lower than (or equal to) the target bit line voltage $V_{BL\_CHARGE}$, e.g., if $V_{CC} \leq 1.76$ V.

Figure 6:
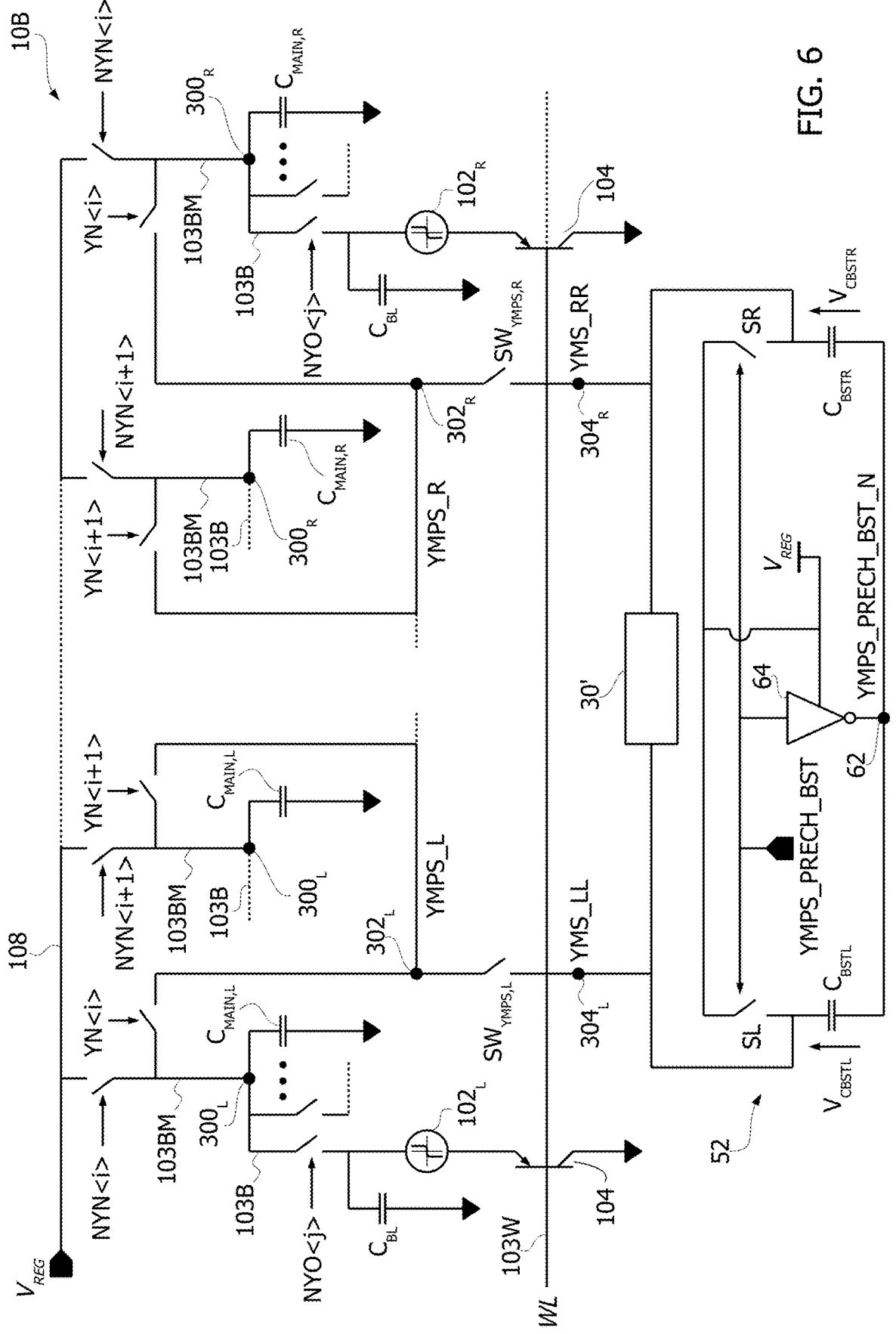
FIG. 6 is a circuit diagram exemplary of a reading architecture in a PCM memory.

FIG. 6 is a circuit diagram exemplary of a reading architecture in a PCM memory bank 10B that implements the functionality described with reference to FIG. 5. In particular, the sense amplifier circuit 52 is coupled to nodes 304$_L$ and 304$_R$ and includes a sense amplifier core such as core 30 (e.g., as discussed with reference to FIG. 3), and further includes a bit line voltage boosting circuit. The sense amplifier circuit 52 is supplied by the low supply voltage $V_{DD}$ (not visible in FIG. 6 for ease of illustration). The bit line voltage boosting circuit is coupled between nodes 304$_L$ and 304$_R$ (e.g., in parallel to the sense amplifier core 30). A first boosting capacitor $C_{BSTL}$ has a first terminal coupled to node 304$_L$ and a second terminal coupled to a switchable node 62, and a second boosting capacitor $C_{BSTR}$ has a first terminal coupled to node 304$_R$ and a second terminal coupled to switchable node 62. The first terminal of capacitor $C_{BSTL}$ is selectively couplable, via a switch SL, to the regulated voltage $V_{REG}$ produced by the LDO 44. The first terminal of capacitor $C_{BSTR}$ is selectively couplable, via a switch SR, to the regulated voltage $V_{REG}$ produced by the LDO 44. Switches SL and SR are controlled by the boost activation signal YMPS_PRECH_BST (e.g., are both closed if signal YMPS_PRECH_BST has the first value (e.g., logic one, asserted) and are both open if signal YMPS_PRECH_BST has the second value (e.g., logic zero, de-asserted)). The bit line voltage boosting circuit further includes an inverter 64 having its input terminal configured to receive signal YMPS_PRECH_BST and its output terminal coupled to switchable node 62. Inverter 64 is supplied by the regulated voltage $V_{REG}$ produced by the LDO 44. Therefore, the complement signal YMPS_PRECH_BST_N of the boost activation signal YMPS_PRECH_BST is produced at switchable node 62.

Figure 7:
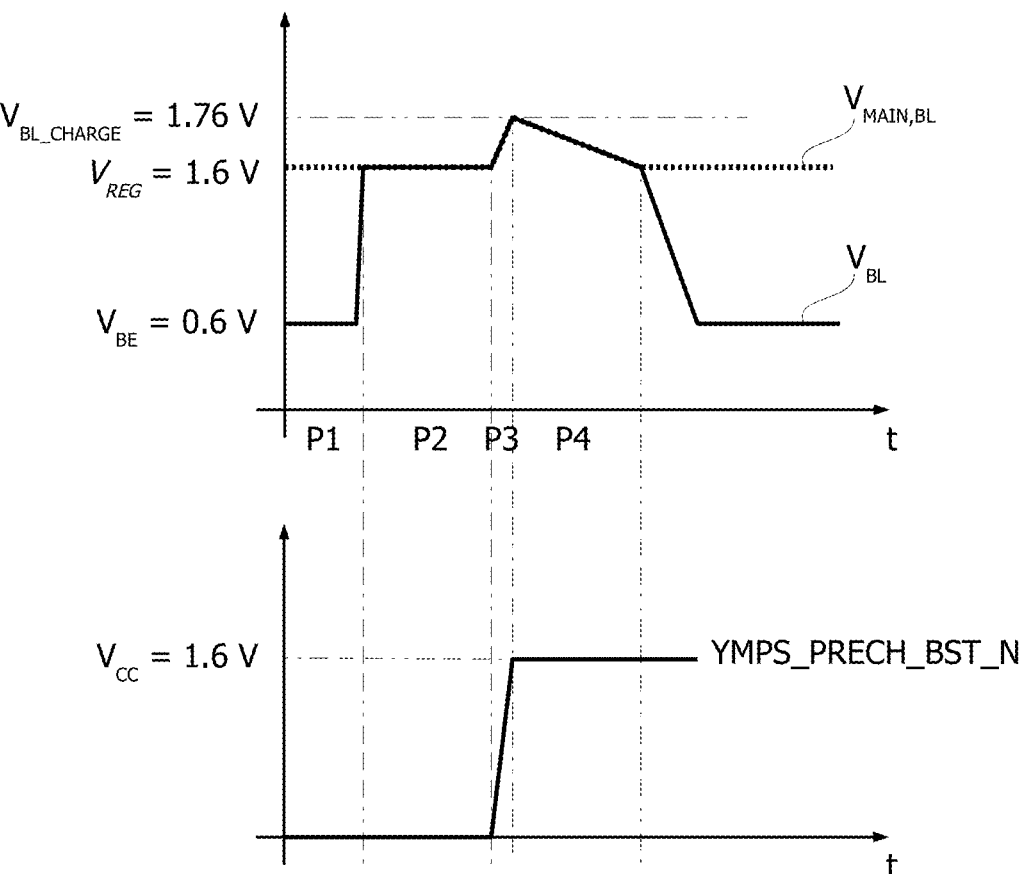
FIG. 7 is a time diagram including waveforms of signals during a read operation in the architecture of FIG. 6.

Read operation in a memory 10 as exemplified in FIG. 6 may be carried out according to the procedure described in the following, which may be better understood by referring to the time diagram of FIG. 7 that includes waveforms of signals during such a read operation.

In a first phase (e.g., P1 in FIG. 7), the main bit lines (e.g., all nodes 300$_L$ and 300$_R$) are connected to the supply voltage rail 108 and charged by the LDO regulator 44 to the voltage $V_{REG}$ (e.g., about 1.6 V). Therefore, the main bit lines are partially pre-charged, i.e., the respective capacitances $C_{MAIN}$ are charged from ground voltage to voltage $V_{REG}$ (see voltage $V_{MAIN,BL}$ in FIG. 7). The word line signal WL applied to the word line 103W is also driven to the voltage $V_{REG}$. Additionally, sensing node 302$_L$ is connected to the input node 304$_L$ of the sense amplifier 52 by closing switch SW$_{YMPS,L}$, and sensing node 302$_R$ is connected to the input node 304$_R$ of the sense amplifier 52 by closing switch SW$_{YMPS,R}$. The boost activation signal YMPS_PRECH_BST is driven to its first value (e.g., asserted, high) so that switches SL and SR are closed, the voltage YMPS_PRECH_BST_N at switchable node 62 is low (e.g., ground) and thus capacitors $C_{BSTL}$ and $C_{BSTR}$ are charged at voltage $V_{REG}$ by the LDO regulator 44. The remaining switches are open during the first phase, that is: all the main bit lines (e.g., nodes 300) are decoupled from the respective sensing node 302, all the bit lines are decoupled from the respective node 300 (at this stage), and switches SW1 and SW2 are open as well.

In a second phase (e.g., still P1 in FIG. 7), switches SW1 and SW2 are closed. In this phase, input offset of the sense amplifier is compensated.

In a third phase (e.g., P2 in FIG. 7), a selected bit line pertaining to the left group is connected to the corresponding main bit line (e.g., node 300$_L$) by closing the respective switch via signal NYO<j>. Similarly, the corresponding selected bit line pertaining to the right group is connected to the corresponding main bit line (e.g., node 300$_R$) by closing the respective switch via signal NYO<j>. Therefore, the selected bit lines are partially pre-charged, i.e., the respective capacitances $C_{BL}$ are charged from voltage $V_{BE}$ (e.g., about 0.6 V) to voltage $V_{REG}$ (see voltage $V_{BL}$ in FIG. 7).

In a fourth phase (e.g., still P2 in FIG. 7), one of nodes 300$_L$ of the left group and the corresponding (e.g., homologous, symmetrical) node 300$_R$ of the right group are disconnected from the supply voltage node 108 by opening the respective switches controlled by signals NYN<i>. Also, those main bit lines (nodes 300$_L$ and 300$_R$) are connected to the sensing nodes 302$_L$ and 302$_R$, respectively, thereby selecting the main bit lines for reading.

In a fifth phase (e.g., P3 in FIG. 7), the word line signal WL applied to a certain word line 103W is driven to ground voltage, thereby activating the selection transistors 104 and performing the actual word line selection (i.e., selection of two specific memory cells 102$_L$ and 102$_R$). At the same time, the boost activation signal YMPS_PRECH_BST is driven to its second value (e.g., de-asserted, low) so that switches SL and SR are opened, the voltage YMPS_PRECH_BST_N at switchable node 62 is forced to a high value (e.g., $V_{REG}$) and the charge stored in capacitors $C_{BSTL}$ and $C_{BSTR}$ at least partially redistributes towards nodes 300$_L$ and 300$_R$, respectively. As a result, capacitive nodes 300$_L$ and 300$_R$ (e.g., the bit line capacitances $C_{BL}$ and the main bit line capacitances $C_{MAIN}$) are boosted to the target reading voltage (e.g., $V_{BL\_CHARGE}$=1.76 V, see voltages $V_{MAIN,BL}$ and $V_{BL}$ in FIG. 7). The voltage at the selected bit lines at the end of the pre-charge phase P3 depends on the sizing of the boosting capacitors $C_{BSTL}$ and $C_{BSTR}$, which may be designed to have the same capacitance (e.g., about 31 fF in one or more embodiments). Subsequently (e.g., P4 in FIG. 7), the capacitive nodes 300$_L$ and 300$_R$ (e.g., the bit line capacitances $C_{BL}$ and the main bit line capacitances $C_{MAIN}$) start discharging and the voltage at nodes 300$_L$ and 300$_R$ drops during the discharge window. Duration of the discharge window is supposed to be short (e.g., 1.5 ns).

In a sixth phase (e.g., still P4 in FIG. 7), switches $SW_{YMPS,L}$ and $SW_{YMPS,R}$ are opened to disconnect the sense amplifier 52 from the memory array. Switches SW1 and SW2 of the sense amplifier core 30' are opened as well. In this state, sensing of a differential signal is carried out by the sense amplifier core 30'.

One or more embodiments as exemplified herein may thus provide a bit line pre-charge architecture that does not include a charge pump circuit for boosting the bit line voltage, insofar as voltage boosting is implemented by a dedicated circuit in the sense amplifier.

An advantage of such a new architecture is a lower power consumption compared to conventional solutions based on a charge pump. For instance, considering the following exemplary parameters $V_{REG}$=1.6 V, $V_{BL\_CHARGE}$=1.76 V, $V_{EB}$=0.6 V, $C_{BL}$=108 fF, $C_{MAIN}$=174 fF, $C_{BST}$=31 fF, the current consumption of a conventional architecture may be about 0.67 µA/MHz per each sense amplifier, while the power consumption of the architecture exemplified in FIG. 6 may be about 0.416 µA/MHz per each sense amplifier, resulting in a current saving of about 38% per each sense amplifier.

Another advantage of such a new architecture is a lower area compared to conventional solutions based on a charge pump. For instance, considering that the driving capability of a charge pump should grant a reading frequency of 100 MHz for 296 sense amplifiers (e.g., 2*(128+17+3) sense amplifiers) insofar as two banks of amplifiers read in parallel 128 bits of data plus 17 ECC bits plus 3 bits of redundancy, the total capacitance required for implementing the charge pump may be about 29.45 pF, while the total capacitance of the architecture exemplified in FIG. 6 may be about 18.35 pF, resulting in an area reduction equivalent to removal of about 37% of the total capacitance.

Without prejudice to the underlying principles, the details and embodiments may vary, even significantly, with respect to what has been described by way of example, without departing from the extent of protection.

The claims are an integral part of the technical teaching provided herein in respect of the embodiments.

The extent of protection is determined by the annexed claims.

The invention claimed is:

1. A sense amplifier circuit for a memory device, the sense amplifier circuit comprising:
   a first input terminal and a second input terminal configured for coupling to a first memory sensing node and a second memory sensing node, respectively;
   a sensing circuit coupled to and configured to sense a differential signal between the first and second input terminals;
   a first boosting capacitor having a first terminal coupled to the first input terminal and a second terminal coupled to a switchable node;
   a second boosting capacitor having a first terminal coupled to the second input terminal and a second terminal coupled to the switchable node;
   control circuitry configured to receive a bit line boosting activation signal and to:
      i) in response to said bit line boosting activation signal having a first value, couple the first terminals of said first and second boosting capacitors to a regulated supply node that provides a regulated supply voltage and drive said switchable node to a ground voltage; and
      ii) in response to said bit line boosting activation signal having a second value, decouple the first terminals of said first and second boosting capacitors from said regulated supply node and drive said switchable node to said regulated supply voltage.

2. The sense amplifier circuit according to claim 1, wherein said control circuitry comprises:
   a first switch arranged between the first terminal of said first boosting capacitor and said regulated supply node, the first switch being controlled by said bit line boosting activation signal;
   a second switch arranged between the first terminal of said second boosting capacitor and said regulated supply node, the second switch being controlled by said bit line boosting activation signal; and
   an inverter circuit having an input terminal controlled by said bit line boosting activation signal and an output terminal connected to said switchable node, the inverter circuit being biased by said regulated supply voltage.

3. The sense amplifier circuit according to claim 2, wherein said sensing circuit comprises:
   a first input capacitor having a first terminal coupled to the first input terminal and a second terminal coupled to a first differential node;
   a second input capacitor having a first terminal coupled to the second input terminal and a second terminal coupled to a second differential node;
   a first inverter circuit having an input terminal coupled to the first differential node and an output terminal coupled to a first intermediate node;
   a first intermediate capacitor coupled between the first intermediate node and the second differential node;
   a second inverter circuit having an input terminal coupled to the second differential node and an output terminal coupled to a second intermediate node; and
   a second intermediate capacitor coupled between the second intermediate node and the first differential node.

4. The sense amplifier circuit according to claim 1, further comprising:
   a first coupling switch configured to selectively couple the first input terminal to the first memory sensing node; and
   a second coupling switch configured to selectively coupled to the second input terminal to the second memory sensing node.

5. The sense amplifier circuit according to claim 4, further comprising:
   a first selection switch configured to selectively couple the first memory sensing node to a first bit line of the memory device; and
   a second selection switch configured to selectively couple the second memory sensing node to a second bit line of the memory device.

6. A memory device, comprising:
   a plurality of memory banks;
   wherein each memory bank comprises:
      a sense amplifier circuit according to claim 1; and
      an array of memory cells arranged in a plurality of bit lines and a plurality of word lines, wherein each memory cell is arranged in series to a respective selection transistor between a ground terminal and the corresponding bit line, and each bit line is selectively couplable to said regulated supply node that provides a regulated supply voltage, or to one of said first and second memory sensing nodes;
   a voltage detector circuit configured to sense a system supply voltage and to detect whether said system supply voltage is higher than a threshold; and a voltage regulator circuit coupled to said system supply voltage and configured to produce said regulated supply voltage at said regulated supply node;

wherein said voltage detector circuit is further configured to:

i) in response to said system supply voltage being higher than said threshold, set an activation signal for said voltage regulator circuit to a first value and disable said bit line boosting activation signal;

ii) in response to said system supply voltage being lower than or equal to said threshold, set the activation signal for said voltage regulator circuit to a second value and enable said bit line boosting activation signal;

iii) set said bit line boosting activation signal to said first value as long as said bit lines are coupled to said regulated supply node; and iv) set said bit line boosting activation signal to said second value in response to a pair of selected bit lines being coupled to said first and second memory sensing nodes, respectively;

wherein said voltage regulator circuit is configured to:

i) in response to said activation signal for said voltage regulator circuit having said first value, regulate said regulated supply voltage to a value equal to said threshold; and ii) in response to said activation signal for said voltage regulator circuit having said second value, regulate said regulated supply voltage to a value close to said system supply voltage.

7. The memory device according to claim 6, wherein:

said plurality of bit lines are arranged in two main groups, each main group including a same number of bit lines;

each main group includes a plurality of main bit lines, each main bit line including a same number of bit lines;

each memory cell is selectively couplable to the respective main bit line via a respective switch; and each main bit line is selectively couplable to said regulated supply node or to a respective one of said first and second memory sensing nodes.

8. A method of operating a memory device according to claim 6, the method comprising:

sensing said system supply voltage and detecting whether said system supply voltage is higher than a threshold;

in response to said system supply voltage being higher than said threshold, setting said activation signal to said first value, regulating said regulated supply voltage to a value equal to said threshold, and disabling said bit line boosting activation signal;

in response to said system supply voltage being lower than or equal to said threshold:

i) setting said activation signal to said second value, thereby regulating said regulated supply voltage to a value close to said system supply voltage;

ii) setting said bit line boosting activation signal to said first value as long as said bit lines are coupled to said regulated supply node, thereby coupling the first terminals of said first and second boosting capacitors to said regulated supply node and driving said switchable node to a ground voltage; and iii) setting said bit line boosting activation signal to said second value in response to a pair of selected bit lines being coupled to said first and second memory sensing nodes, respectively, thereby decoupling the first terminals of said first and second boosting capacitors from said regulated supply node and driving said switchable node to said regulated supply voltage.

\* \* \* \* \*